(12) United States Patent
Nakamura

(10) Patent No.: US 6,355,977 B1
(45) Date of Patent: Mar. 12, 2002

(54) SEMICONDUCTOR CHIP OR DEVICE HAVING A CONNECTING MEMBER FORMED ON A SURFACE PROTECTIVE FILM

(75) Inventor: Tomofumi Nakamura, Kyoto (JP)

(73) Assignee: Rohm, Co., Ltd., Kyoto (JP)

( * ) Notice: Subject to any disclaimer, the term of this patent is extended or adjusted under 35 U.S.C. 154(b) by 0 days.

(21) Appl. No.: 09/504,856

(22) Filed: Feb. 16, 2000

(30) Foreign Application Priority Data

Feb. 18, 1998 (JP) .......................................... 11-040401

(51) Int. Cl.[7] .................. H01L 21/70; H01L 23/48; H01L 23/544; H01L 29/40; H01L 27/15
(52) U.S. Cl. .................. 257/693; 257/700; 257/701; 257/758; 257/774; 257/680; 257/786; 257/784; 257/776; 257/778; 257/692; 257/777; 257/738
(58) Field of Search .................. 252/777–781, 252/772, 738, 732, 734, 721, 758, 692, 693, 784, 786, 723, 686, 685, 774

(56) References Cited

U.S. PATENT DOCUMENTS

| | | | |
|---|---|---|---|
| 5,757,179 A | * 5/1998 | McAllister et al. | 257/758 |
| 5,834,844 A | * 11/1998 | Akagawa et al. | 257/738 |
| 5,898,223 A | * 4/1999 | Frye et al. | 257/777 |
| 5,903,044 A | * 5/1999 | Farnworth et al. | 257/758 |
| 5,960,308 A | * 9/1999 | Akagawa et al. | 438/613 |
| 5,976,953 A | * 11/1999 | Zavracky et al. | 438/455 |
| 5,977,641 A | * 11/1999 | Takahashi et al. | 257/778 |
| 6,002,163 A | * 12/1999 | Wojnarowski | 257/777 |
| 6,005,262 A | * 12/1999 | Cunningham et al. | 257/778 |
| 6,008,543 A | * 12/1999 | Iwabuchi | 257/778 |

* cited by examiner

Primary Examiner—Alexander O. Williams
(74) Attorney, Agent, or Firm—Rader, Fishman & Grauer, PLLC

(57) ABSTRACT

A semiconductor chip which is joined to a surface of a solid such as a semiconductor chip or a wiring board. The semiconductor chip includes a surface protective film formed on its surface opposite to the surface of the solid, a connecting member formed on the surface protective film for electrically connecting the semiconductor chip and the solid to each other, and surface wiring for connecting internal wiring under the surface protective film and the connecting member to each other.

11 Claims, 2 Drawing Sheets

F I G. 1
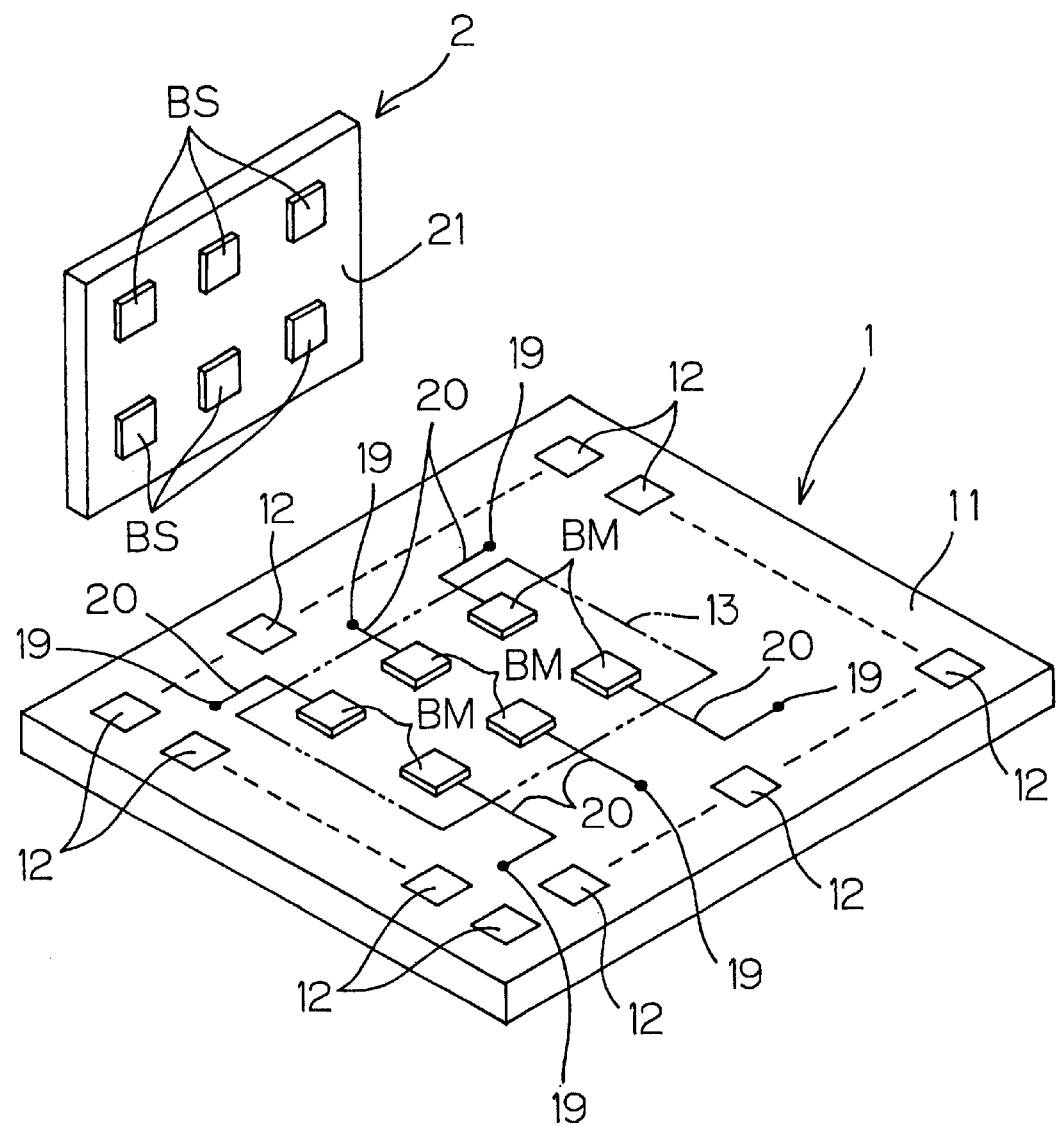

SEMICONDUCTOR CHIP OR DEVICE HAVING A CONNECTING MEMBER FORMED ON A SURFACE PROTECTIVE FILM

BACKGROUND OF THE INVENTION

1. Field of the Invention

The present invention relates to a semiconductor chip which is applicable to a chip-on-chip structure in which semiconductor chips are joined to each other by overlapping one of the semiconductor chips with a surface of the other semiconductor chip, and also applicable to a flip-chip-bonding structure in which a semiconductor chip and a printed wiring board are joined to each other by opposing a surface of the semiconductor chip to the printed wiring board.

2. Description of Related Art

An example of a structure for miniaturizing and increasing the integration density of a semiconductor device is a so-called chip-on-chip structure in which paired semiconductor chips are overlapped with and joined to each other such that their surfaces are opposite to each other.

A pad opening, for example, for partially exposing internal wiring is formed on the surface of the semiconductor chip which is applied to the chip-on-chip structure. A bump is provided on the internal wiring exposed through the pad opening. The respective bumps in the semiconductor chips which are opposite to each other are joined to each other, to achieve electrical connection between the semiconductor chips.

When the semiconductor chips are joined to each other, the bumps in the opposite semiconductor chips are made to adhere to each other by heat applied to respective joints of the bumps while being pressed against to each other, for example. When a functional device such as a transistor is arranged below the bump, a force or heat applied to the bump is propagated to the functional device through the internal wiring, which may degrade the characteristics of the functional device.

In the semiconductor chip which is applied to the chip-on-chip structure, therefore, a region where the bump is to be formed (a region to which another semiconductor chip is to be joined) must be provided in a place other than a region where the functional device is to be formed. This prevents the chip size to be reduced.

SUMMARY OF THE INVENTION

An object of the present invention is to provide a semiconductor chip capable of reducing the chip size.

A semiconductor chip according to the present invention is a semiconductor chip which is joined to a surface of a solid, which comprises a surface protective film formed on its surface opposite to the surface of the solid; a connecting member formed on the surface protective film for supporting the semiconductor chip on the surface of the solid and electrically connecting the semiconductor chip and the solid to each other; and surface wiring for connecting internal wiring formed under the surface protective film and the connecting member to each other.

For example, when a pad opening for exposing a part of the internal wiring is formed in the surface protective film that covers the internal wiring, the surface wiring may connect the internal wiring and the connecting member to each other through the pad opening.

The surface of the solid may be a surface of another semiconductor chip or a surface of a wiring board.

The connecting member may be a metal bump provided in a raised state on the surface protective film, or a metal evaporated film which is not so high as the metal bump.

According to the present invention, the connecting member for electrical connection to the semiconductor chip, the wiring board, or the like (the solid) is formed on the surface protective film, and is connected to the internal wiring through the surface wiring. Consequently, a force or heat applied to the connecting member at the time of joining the semiconductor chip and the solid to each other, is absorbed by the surface protective film. Even if a functional device is arranged below the connecting member, therefore, the characteristics of the functional device are not degraded. Accordingly, the functional device can be arranged below the connecting member, thereby making it possible to reduce the chip size.

Furthermore, the internal wiring and the pad opening can be formed in positions independent of the connecting member, thereby making it possible to design an internal circuit in the solid to be joined without considering the layout of the internal circuit. Consequently, it is possible to further miniaturize the semiconductor chip.

The connecting member can be arranged in an arbitrary position on the surface protective film. When the semiconductor chip is applied as a primary chip in a semiconductor device having a chip-on-chip structure, for example, therefore, the degree of freedom of an arrangement of another semiconductor chip (a secondary chip) on the primary chip is increased. When a plurality secondary chips are joined to the primary chip, therefore, the plurality of secondary chips can be efficiently arranged on the primary chip, thereby making it possible to prevent the chip size of the primary chip from being increased.

The connecting member may be formed by stacking a seed film on a surface of the surface protective film having the pad opening formed therein and selectively plating the seed film. In this case, it is preferable that the surface wiring is formed by patterning the seed film. In this case, a material for the surface wiring need not be prepared, thereby making it possible to prevent the cost of the semiconductor chip from being increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an exploded perspective view of a semiconductor device using semiconductor chips according to an embodiment of the present invention.

DESCRIPTION OF THE PREFERRED EMBODIMENTS

Figure 2:
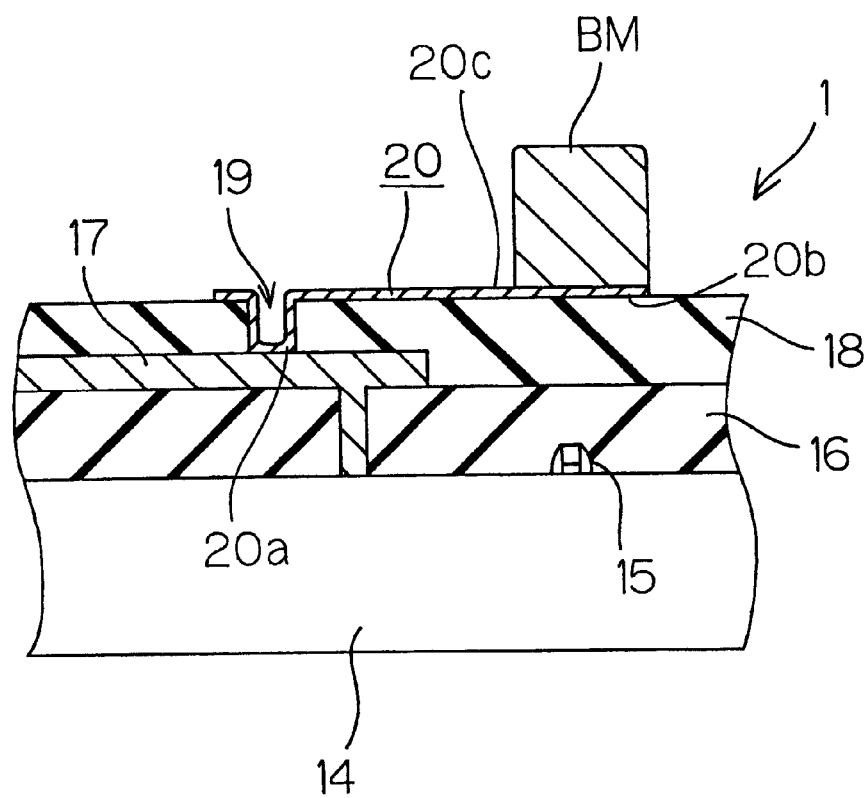
FIG. 2 is a cross-sectional view showing the construction of a primary chip in an enlarged manner.

FIG. 1 is an exploded perspective view of a semiconductor device using semiconductor chips according to an embodiment of the present invention. The semiconductor device has a so-called chip-on-chip structure in which a daughter chip or secondary chip 2 is overlapped with and joined to a surface 11 of a mother chip or primary chip 1.

The primary chip 1 is composed of a silicon chip, for example. The surface 11 of the primary chip 1 is a surface on the side of an active surface layer region where a functional device such as a transistor is formed on a semiconductor substrate forming a base body of the primary chip 1, and its uppermost surface is covered with a surface protective film having insulating properties. A plurality of pads 12 to be connected to a lead frame by a bonding wire, for example, are arranged in the vicinities of peripheral edges of the surface 11 of the primary chip 1. A joint region 13 to which the secondary chip 2 is to be joined is set in an inner part of the surface 11 of the primary chip 1. A plurality of bumps BM for connection to the secondary chip 2 are arranged in the joint region 13.

The secondary chip 2 is composed of a silicon chip, for example. A surface 21 of the secondary chip 2 is a surface on the side of an active surface layer region where a functional device such as a transistor is formed on a semiconductor substrate forming a base body of the secondary chip 2, and its uppermost surface is covered with a surface protective film having insulating properties. A plurality of bumps BS connected to internal wiring are provided on the surface 21 of the secondary chip 2.

The secondary chip 2 is joined to the primary chip 1 by a so-called face-down bonding in which the surface 21 is opposed to the surface 11 of the primary chip 1. The bumps BM in the primary chip 1 are provided in positions considering the bumps BS in the secondary chip 2. The secondary chip 2 is supported above the primary chip 1 and is electrically connected to the primary chip 1 by respectively connecting the bumps BS to the corresponding bumps BM in the primary chip 1.

FIG. 2 is a cross-sectional view showing the construction of the primary chip 1 in an enlarged manner. An insulating film 16 covering a functional device 15 is formed on a semiconductor substrate 14 in the primary chip 1. Internal wiring 17 is disposed on the insulating film 16. Respective surfaces of the insulating film 16 and the internal wiring 17 are covered with a surface protective film 18 composed of silicon nitride, for example. A pad opening 19 for exposing a part of the internal wiring 17 is formed in the surface protective film 18.

Surface wiring 20 connected to the internal wiring 17 is disposed through the pad opening 19 on the surface protective film 18. A bump BM made of an oxidation-resistant metal is provided in a raised state on a front end of the surface wiring 20. That is, the surface wiring 20 has a first connecting portion 20a connected to the internal wiring 17 through the pad opening 19, a second connecting portion 20b connected to the bump BM, and an intermediate portion 20c connected to the first and second connecting portions 20a and 20b.

The bump BM is arranged on the surface protective film 18 in consideration of the bump BS in the secondary chip 2. The surface wiring 20 is patterned such that the bump BM is connected to the internal wiring 17. Examples of the oxidation-resistant metal include gold, platinum, silver, palladium, and iridium.

The surface wiring 20 can be composed of a seed film formed on a surface of the surface protective film 18 in order to form the bump BM. In this case, the bump BM and the surface wiring 20 can be formed in the following manner.

The pad opening 19 is first formed in the surface protective film 18 by a photolithographic technique. The seed film is then formed by sputtering on the surface of the surface protective film 18 having the pad opening 19 formed therein. When the bump BM is composed of Au (gold), for example, the seed film may be formed by making a TiW (titanium tungsten) film adhere to the surface protective film 18 by sputtering and making an Au film adhere to the TiW film by sputtering. A patterning film is formed on the seed film other than a region where the bump BM is to be formed, and the seed film is then subjected to plating using a material for the bump BM, thereby forming the raised bump BM on the seed film. Thereafter, the patterning film on the seed film is removed, and the seed film thus exposed is patterned such that the bump BM and the internal wiring 17 are connected to each other through the pad opening 19, thereby making it possible to obtain the surface wiring 20 composed of the seed film.

As described in the foregoing, according to the present embodiment, the bump BM for connection to the secondary chip 2 is arranged on the surface protective film 18, and is connected to the internal wiring 17 through the surface wiring 20. Consequently, a force or heat applied to the bump BM at the time of joining the primary chip 1 and the secondary chip 2 to each other is absorbed by the surface protective film 18. Even if the functional device 15 is arranged below the bump BM, therefore, the characteristics of the functional device 15 are not degraded. Accordingly, a region where the functional device is to be formed can be provided below the joint region 13 set on the surface of the primary chip 1, thereby making it possible to miniaturize the primary chip 1.

Furthermore, the internal wiring 17 and the pad opening 19 can be formed in positions independent of the bump BM. Accordingly, the internal wiring 17 and the pad opening 19 need not be formed in conformity with the position of the bump BS in the secondary chip 2. That is, a circuit in the primary chip 1 can be designed without considering the bump BS in the secondary chip 2. Consequently, it is possible to further miniaturize the primary chip 1.

The bump BM can be arranged in an arbitrary position on the surface protective film 18. Accordingly, the degree of freedom of an arrangement of the secondary chip 2 on the primary chip 1 is increased. When a plurality of secondary chips 2 are joined to the primary chip 1, therefore, the plurality of secondary chips 2 can be efficiently arranged on the primary chip 1, thereby making it possible to prevent the increase of the chip size of the primary chip 1.

Although description has been made of an embodiment of the present invention, the present invention is not limited to the embodiment of the present invention. Although in the above-mentioned embodiment, the surface wiring 20 is composed of the seed film for forming the bump BM, the surface wiring 20 may be composed of a metal film different from the seed film.

Although in the above-mentioned embodiment, both the primary chip 1 and the secondary chip 2 are chips composed of silicon, they may be semiconductor chips using another arbitrary semiconductor material, for example, a gallium arsenic semiconductor or a germanium semiconductor. In this case, a semiconductor material for the primary chip 1 and a semiconductor material for the secondary chip 2 may be the same as or different from each other.

Furthermore, although both the primary chip 1 and the secondary chip 2 are respectively provided with the bumps BM and BS, chip-on-chip joining between the primary chip 1 and the secondary chip 2 may be achieved by providing one of the primary chip 1 and the secondary chip 2 with a bump and providing the other chip with a metal evaporated film which is not so high as the bump to join the bump and the metal evaporated film to each other.

Additionally, although in the above-mentioned embodiment, a case where the present invention is applied to the primary chip 1 is taken as an example by taking up the semiconductor device having a chip-on-chip structure, the present invention may be, of course, applied to the secondary chip 2. Further, the present invention may be applied to a semiconductor chip used in a semiconductor device having a so-called flip-chip-bonding structure in which a surface of a semiconductor chip is opposed and joined to a printed wiring board.

Although the present invention has been described and illustrated in detail, it is clearly understood that the same is by way of illustration and example only and is not to be taken by way of limitation, the spirit and scope of the present invention being limited only by the terms of the appended claims.

This application claims priority benefits under 35 USC §119 of Japanese Patent Application Serial No. 11-40401 filed with the Japanese Patent Office on Feb. 18, 1999, the disclosure of which is incorporated hereinto by reference.

What is claimed is:

1. A semiconductor chip joined to a surface of a solid, comprising:

a surface protective film formed on a surface of the semiconductor chip that is opposite to the surface of the solid;

a connecting member formed on the surface protective film for supporting the semiconductor chip on the surface of the solid and electrically connecting the semiconductor chip and the solid to each other; and surface wiring, formed on the surface protective film and exposed to the outside of the semiconductor chip, for connecting internal wiring formed under the surface protective film and the connecting member to each other.

2. The semiconductor chip according to claim 1, further comprising a pad opening which is formed in the surface protective film for exposing a part of the internal wiring which is covered with the surface protective film, the surface wiring connecting the internal wiring and the connecting member to each other through the pad opening.

3. The semiconductor chip according to claim 2, wherein the connecting member is formed by stacking a seed film on a surface of the surface protective film having the pad opening formed therein and selectively plating the seed film, and the surface wiring is formed by patterning the seed film.

4. The semiconductor chip according to claim 2, wherein the surface wiring includes a first connecting portion connected to the internal wiring through the pad opening, a second connecting portion connected to the connecting member, and an intermediate portion formed on the surface of the surface protective film and connected to the first connecting portion and the second connecting portion.

5. A semiconductor device of a chip-on-chip type constructed by opposing a surface of a first semiconductor chip to a surface of a second semiconductor chip to join the first and second semiconductor chips to each other, comprising:

a surface protective film formed on the surface, opposite to the second semiconductor chip, of the first semiconductor chip, a connecting member formed between the surface protective film and the second semiconductor chip for electrically connecting the first and second semiconductor chips, and surface wiring, formed on the surface protective film and exposed to the outside of the semiconductor chip, for connecting internal wiring formed under the surface protective film and the connecting member to each other.

6. The semiconductor device according to claim 5, wherein a pad opening for exposing a part of the internal wiring which is covered with the surface protective film is formed in the surface protective film, and the surface wiring connects the internal wiring and the connecting member to each other through the pad opening.

7. The semiconductor device according to claim 6, wherein the surface wiring includes a first connecting portion connected to the internal wiring through the pad opening, a second connecting portion connected to the connecting member, and an intermediate portion formed on a surface of the surface protective film and connected to the first connecting portion and the second connecting portion.

8. A semiconductor chip according to claim 1, which further comprises an insulating film formed on an opposite side of said internal wiring relative to said surface protective film, and also between a semiconductor substrate and said surface protective film.

9. A semiconductor device according to claim 5, which further comprises an insulating film formed on an opposite side of said internal wiring relative to said surface protective film, and also between a semiconductor substrate and said surface protective film.

10. A semiconductor chip according to claim 8, wherein said insulating film includes an opening through which said internal wiring contacts said semiconductor substrate.

11. A semiconductor device according to claim 9, wherein said insulating film includes an opening through which said internal wiring contacts said semiconductor substrate.

* * * * *

UNITED STATES PATENT AND TRADEMARK OFFICE
CERTIFICATE OF CORRECTION

PATENT NO. : 6,355,977 B1
DATED : March 12, 2002
INVENTOR(S) : Tomofumi Nakamura It is certified that error appears in the above-identified patent and that said Letters Patent is hereby corrected as shown below:

<u>Title page,</u>
Item [30], Foreign Application Priority Data, the date should read
-- February 18, 1999 --

Signed and Sealed this

Eleventh Day of March, 2003

JAMES E. ROGAN
*Director of the United States Patent and Trademark Office*